United States Patent
Nishiura et al.

[11] Patent Number: 5,989,995
[45] Date of Patent: Nov. 23, 1999

[54] SEMICONDUCTOR DEVICE AND WIRE BONDING METHOD THEREFOR

[75] Inventors: Shinichi Nishiura, Fussa; Tooru Mochida, Higashiyamato, both of Japan

[73] Assignee: Kabushiki Kaisha Shinkawa, Tokyo, Japan

[21] Appl. No.: 08/998,914

[22] Filed: Dec. 29, 1997

[30] Foreign Application Priority Data

Dec. 27, 1996 [JP] Japan ................................. 8-357517

[51] Int. Cl.⁶ ................................................ H01L 21/44
[52] U.S. Cl. ...................... 438/617; 438/612; 228/180.5
[58] Field of Search ................................. 438/617, 124, 438/612, 613, 615; 228/180.5

[56] References Cited

U.S. PATENT DOCUMENTS

| | | | |
|---|---|---|---|
| 4,932,584 | 6/1990 | Yamazaki et al. | 228/180.5 |
| 5,148,964 | 9/1992 | Shimizu | 228/180.5 |
| 5,156,323 | 10/1992 | Kumazawa et al. | 220/180.5 |
| 5,205,463 | 4/1993 | Holdgrafer et al. | 228/180.5 |
| 5,259,548 | 11/1993 | Yamazaki et al. | 228/180.5 |
| 5,863,810 | 1/1999 | Kaldenberg | 438/124 |

FOREIGN PATENT DOCUMENTS

H4-318943  11/1992  Japan.
H5-60657   9/1993   Japan.

*Primary Examiner*—Kevin M. Picardat
*Attorney, Agent, or Firm*—Koda & Androlia

[57] ABSTRACT

A semiconductor device including a bonded wire that connects a first bonding point and a second bonding point and has a linear portion in the top area thereof, the linear portion being bent or depressed down, thus having a high shape-retaining strength.

4 Claims, 5 Drawing Sheets

SEMICONDUCTOR DEVICE AND WIRE BONDING METHOD THEREFOR

BACKGROUND OF THE INVENTION

1. Field of the Invention

The present invention relates to a semiconductor device and also to a wire bonding method for connecting a first bonding point and a second bonding point by a wire and more particularly to a semiconductor device that has a particular wire loop shape and to a method for forming wire loop having such a particular shape.

2. Prior Art

As shown in FIGS. 5(a) and 5(b), in a semiconductor device, a pad 2a (first bonding point) on a semiconductor chip 2 mounted on a lead frame 1 and a lead 1a (second bonding point) on the lead frame 1 are connected by a bonding wire (called merely "wire") 3. The loop shape of the wire 3 in this case may be a trapezoidal loop shape as shown in FIG. 5(a) or a triangular loop shape as shown in FIG. 5(b).

Wire loop formation methods of this type are described in, for example, Japanese Patent Application Publication (Kokoku) No. 5-60657 and Japanese Patent Application Laid-Open (Kokai) No. 4-318943.

The trapezoidal loop shown in FIG. 5(a) is formed by the process shown in FIG. 6.

In step (a) shown in FIG. 6, a capillary 4 is lowered so that a ball (not shown) formed on the tip end of the wire 3 is bonded to a first bonding point A. This is done while a damper (not shown), which is located above the capillary 4 and can hold the wire when closed and feed the wire when opened, is opened. After this, the capillary 4 is raised to point B delivering the wire 3.

Next, as seen in step (b), the capillary is moved horizontally in the opposite direction from the second bonding point G to point C. Generally, to move the capillary 4 in the direction opposite from the second bonding point G (for forming a loop in the wire) is referred to as a "reverse operation". Because of this reserve operation, the wire 3 assumes a shape that extends from point A to point C; and as a result, a kink 3a is formed in a portion of the wire 3. The wire 3 delivered in the process from point A to point C forms the neck height portion 31 of the loop shown in FIG. 4(a).

Next, in step (c), the capillary 4 is raised to point D while delivering the wire 3.

Afterward, as shown in step (d), the capillary 4 is again moved horizontally to point E in the opposite direction from the second bonding point G, i. e., another (or second) reverse operation is performed. As a result, the wire 3 assumes a shape inclined from point C to point E, and a kink 3b is formed in a portion of the wire 3. The wire 3 delivered out of the capillary 4 in the process from point C to point E forms the trapezoidal length portion 32 shown in FIG. 5(a).

Furthermore, in step (e), the capillary 4 is raised to point F while delivering the wire 3. The amount of wire 3 delivered is equal to the inclined portion 33 shown in FIG. 5(a). Afterward, the damper (again, not shown) is closed. Once the damper is closed, the wire 3 is not delivered even if the capillary 4 subsequently is moved.

As shown in steps (f) and (g), the capillary 4 performs a circular-arc motion (or a circular-arc motion followed by a straightly lowering motion) so that the capillary 4 is positioned at the second bonding point G, and the wire 3 is bonded to the second bonding point G, thus connecting the first and second bonding points A and G.

On the other hand, the triangular loop shown in FIG. 5(b) is formed by the process shown in FIG. 7.

In this triangular loop formation, the trapezoidal length portion 32 described in the above loop formation is not formed. Accordingly, the second reverse operation in step (d) in FIG. 6 is not performed. Thus, the steps (c), (d) and (e) in FIG. 6 are replaced by the single process as shown in step (c) of FIG. 7. In particular, the steps (a) and (b) are the same as the steps (a) and (b) shown in FIG. 6, respectively; and after the first reverse operation in step (b) of FIG. 7, the capillary 4 is raised to point F while delivering the wire 3 in step (c). Afterward, the capillary 4 performs the operations steps (d) and (e) in the same manner as the operations done in the steps (f) and (g) shown in FIG. 6, so that the wire 3 is bonded to the second bonding point G.

As seen from the above, the triangular loop formation shown in FIG. 7 is simpler than the trapezoidal loop formation shown in FIG. 6 and is therefore advantageous in that the loop formation is performed in a shorter time. However, in cases where the height difference between the first bonding point A and the second bonding point G is large, or in cases there is a large distance between the first bonding point A and the edge portion of the semiconductor chip 2, the wire 3 tends to come into contact with the edge portion of the semiconductor chip 2 when the triangular wire loop shape as shown in FIG. 5(b) is formed. In such cases, the trapezoidal wire loop formation is employed so as to avoid the contact between the wire 3 and semiconductor chip 2.

In the trapezoidal loop formation process shown in FIG. 6, the first reverse operation shown in step (b) is performed with the capillary 4 in a position which is at a height close to the height of the first bonding point A. Accordingly, the kink 3a is relatively strong. However, the second reverse operation shown in step (d) is performed with the capillary 4 in a high position which is far away from the first bonding point A. Accordingly, the kink 3b is difficult to form and is unstable. As a result, the portion of the wire in the vicinity of the kink 3b (see FIG. 5(a)) tends to unstable and has a weak shape-retaining strength, and therefore, this portion of the wire in the vicinity of the kink 3b may rise up or drop downward. If the shape-retaining strength of the portion of the wire near the kink 3b is weak, the wire may bend when pressure from the outside is applied thereon. For example, wire bending may easily be caused by external forces such as shocks or vibration of the wire 3 due to capillary contact or ultrasonic oscillation during bonding to the second bonding point G, or mold flow due to the injection of molding material during molding, etc.

SUMMARY OF THE INVENTION

Accordingly, it is a primary object of the present invention to solve the problems of a conventional trapezoidal loop.

It is another object of the present invention to provide a semiconductor device which has a stable wire loop shape with a high shape-retaining strength and a wire bonding method which can form such a wire loop shape.

The object of the present invention is accomplished by a unique structure for a semiconductor device in which a wire connecting a first bonding point and a second bonding point on a lead frame forms a wire loop that includes a linear portion at the top of the wire loop, and this linear portion is depressed downward or toward the lead frame.

The object of the present invention is further accomplished by another unique structure for a semiconductor device in which a wire connecting a first bonding point and a second bonding point on a lead frame is formed into a trapezoidal shape, in which a kink is formed in the trapezoidal length portion of the wire loop, so that the trapezoidal portion is formed into a shape depressed downward or toward the lead frame.

The object of the present invention is also accomplished by a unique wire bonding method for connecting a first bonding point and a second bonding point, which includes the steps of: connecting the wire to the first bonding point; performing a first reverse operation in which a capillary is raised slightly and then moved slightly in the opposite direction from the second bonding point; performing a second reverse operation at least once in which the capillary is raised, moved slightly toward the second bonding point, raised again and then moved in the opposite direction from the second bonding point; and further raising the capillary, moving the capillary toward the second bonding point and then connecting the wire to the second bonding point.

DETAILED DESCRIPTION OF THE INVENTION

Figure 5A:
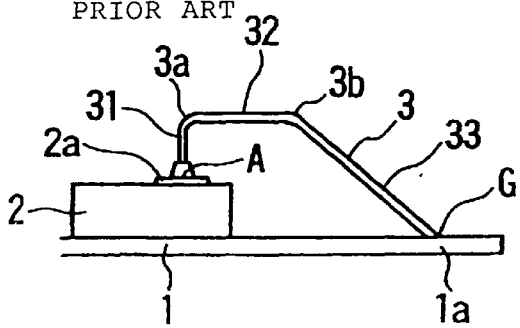
FIG. 5(a) shows a conventional trapezoidal wire loop shape.
Figure 5B:
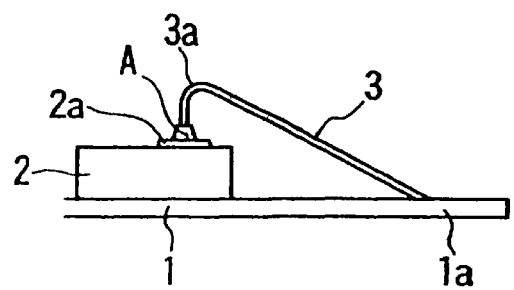
FIG. 5(b) shows a conventional triangular wire loop shape.

One embodiment of the semiconductor device of the present invention will be described with reference to FIG. 1. Constituting elements which are the same as in FIG. 5(a) or which correspond to elements in FIG. 5(a) are labeled with the same symbols in the following description.

Figure 1:
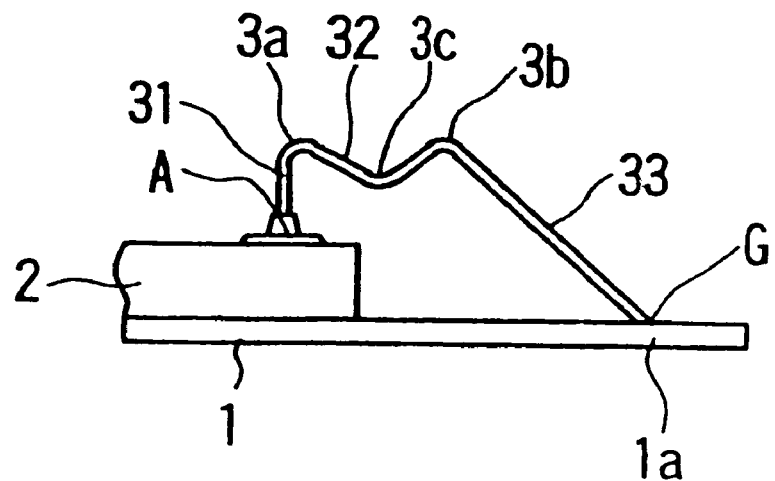
FIG. 1 is an explanatory diagram which illustrates one embodiment of the wire loop shape of a semiconductor device according to the present invention.

As seen from FIG. 1, the wire loop which connects the first bonding point A and second bonding point G includes a neck height portion 31, a trapezoidal length portion 32 and an inclined portion 33 along with two kinks 3a and 3b formed at both ends of the trapezoidal length portion 32, thus in this regard being similar to a conventional semiconductor device. In the present invention, however, a third or intermediate kink 3c is further formed in the trapezoidal length portion 32 so that the shape of the trapezoidal length portion 32 is formed into a shape which is depressed downward or toward the lead frame 1. In other words, the trapezoidal length portion 32 of the wire 3 is bent at an intermediate point thereof toward a surface on which the both ends of the wire 3 is bonded Since the kink 3c is thus formed in the trapezoidal length portion 32 of the wire loop so that the trapezoidal length portion 32 has a depressed or downwardly bent shape, the position where the kink 3b is located is stabilized because of the presence of the kink 3c, and a wire loop having a high shape-retaining strength is obtained.

Next, one embodiment of the wire bonding method of the present invention for obtaining a semiconductor device of the type shown in FIG. 1 will be described with reference to FIGS. 2 and 3. Constituting elements which are the same as those in FIG. 5(a) and FIG. 6 will be labeled with the same symbols in the following description. In this embodiment, the steps (c) through (e) shown in FIG. 6 for the trapezoidal loop are altered to steps (c) through (g) of FIG. 3. The remaining steps are the same as the steps shown in FIG. 6. In other words, the steps (a), (b), and (h) through (i) of FIG. 3 are the same as the steps (a), (b), and (f) through (g) shown in FIG. 6.

First, the steps (a) and (b) in FIG. 3, which are the same as in a conventional method, will be described.

In step (a), a capillary 4 through which a bonding wire 3 passes through is lowered with the damper (not shown) which holds the wire 3 kept closed, so that a ball (not shown) formed on the tip end of the wire is bonded to a first bonding point A, after which the capillary 4 is raised (or moved in a direction opposite from the first bonding point A) to point B delivering the wire 3.

Next in step (b), a reverse operation is performed. In other words, the capillary is moved horizontally to point C in the opposite direction from the second bonding point G. As a result, a kink 3a is formed in a portion of the wire 3 as in a conventional method. The wire 3 delivered out of the capillary 4 in the process from point A to point C forms a neck height portion 31 (see FIG. 2).

Next, the steps that characterize the present invention are performed.

Figure 6:
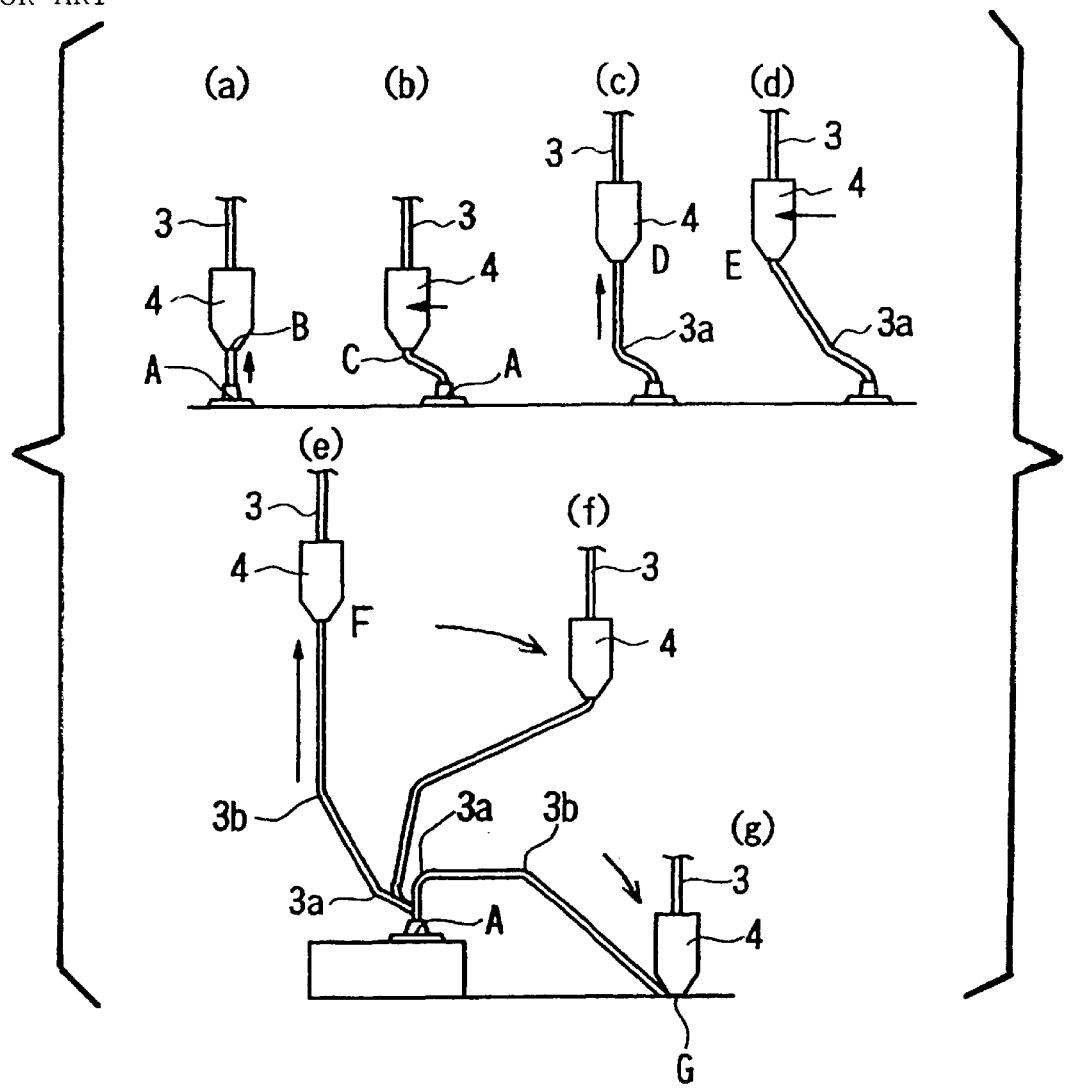
FIG. 6 shows steps (a) through (g) for forming the trapezoidal wire loop shown in FIG. 5(a)
Figure 7:
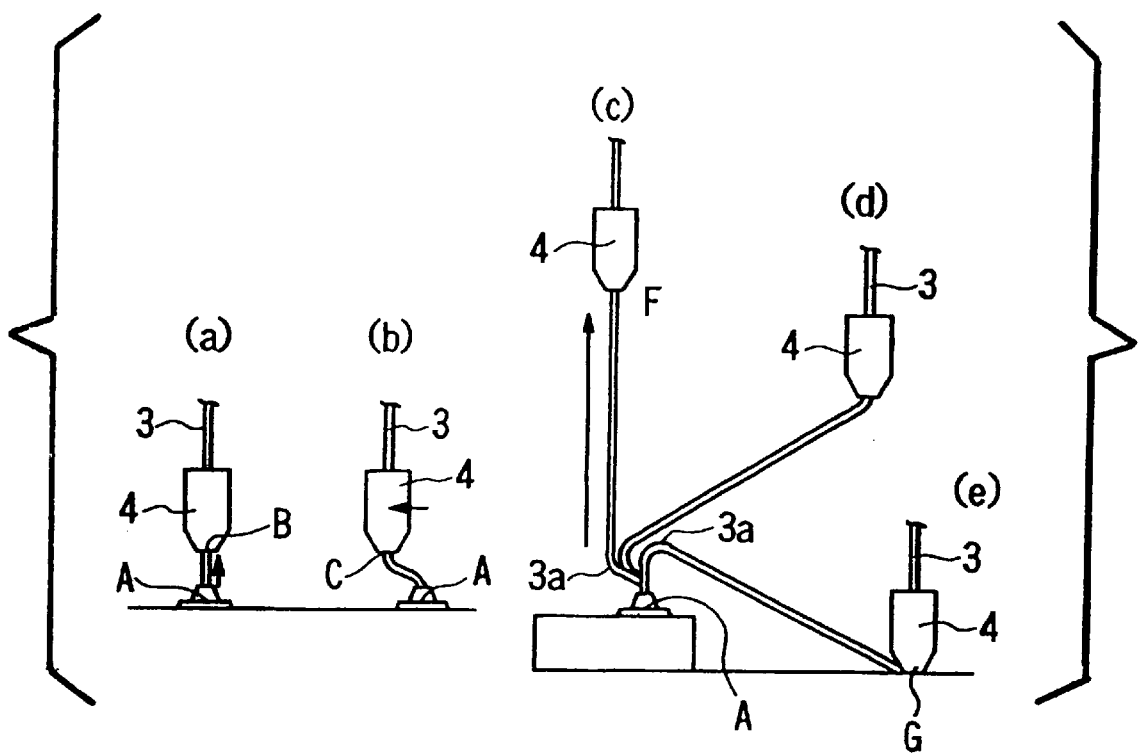
FIG. 7 shows steps (a) through (e) for forming the triangular loop shown in FIG. 5(b).

More specifically, in step (c), the capillary 4, while delivering the wire 3, is raised (or moved in a direction away from the first bonding point A) to a point D1 which is approximately halfway between point C and point D (see step (e) of FIG. 3 and step (c) of FIG. 6).

Afterward, as shown in step (d), the capillary 4 is moved in the direction toward the second bonding point G to point D2 (up to more or less directly above the first bonding point A).

Then, as shown in step (e), the capillary 4 delivering the wire 3 is raised (or moved in a direction away from the first bonding point A) to point D. As a result of the steps (d) and (e), a kink 3c is formed in the wire 3. The length of wire 3 delivered out of the capillary 4 in the operation from point D1 to point D2 (i. e., the length from the kink 3a to the kink 3c) forms a lateral wire portion 34 (see step 34).

Next, in step (f), the capillary 4 is moved in the opposite direction from the second bonding point G, i. e., thus being caused to perform a second reverse operation so that the capillary is moved horizontally to point E. As a result of this operation from point C to point E, a kink 3b is formed in the wire 3. The wire 3 delivered out of the capillary 4 at this time forms the second lateral wire portion 35 shown in FIG. 1.

Figure 2:
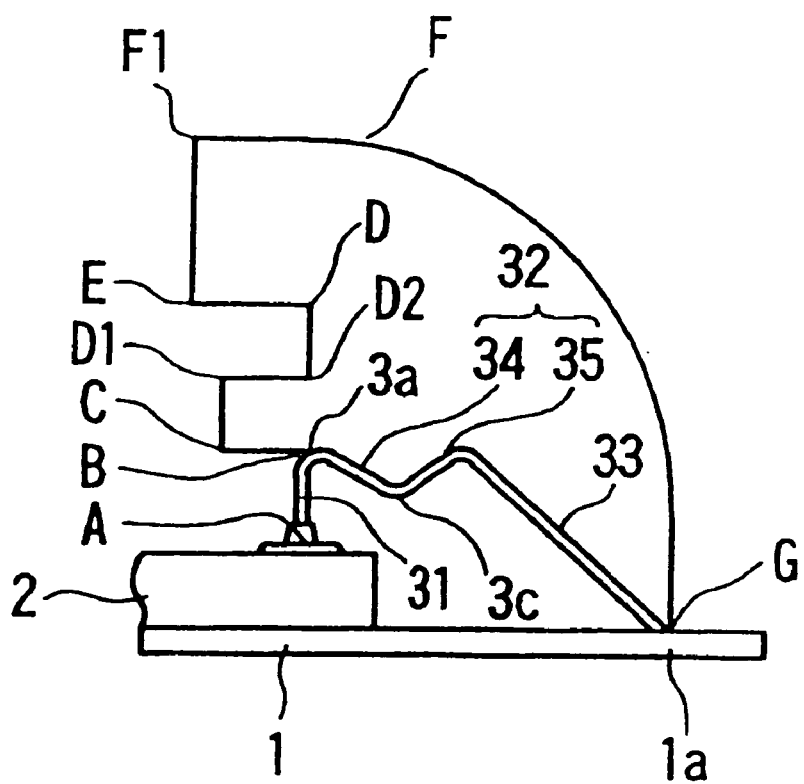
FIG. 2 is an explanatory diagram which illustrates one embodiment of the capillary track and connected state of the wire according to the present invention.
Figure 3:
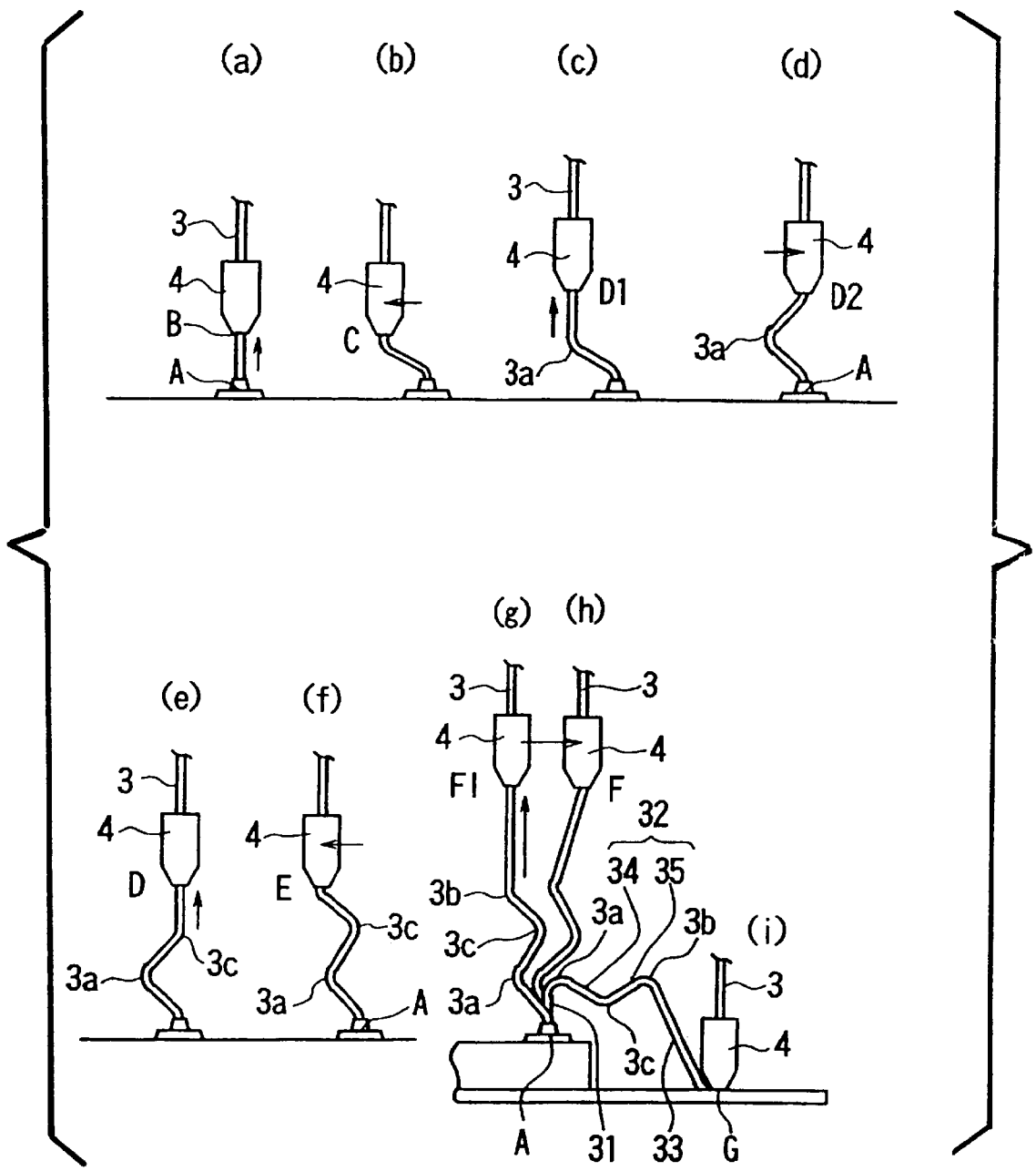
FIG. 3 shows diagrams which illustrate the respective wire shapes formed by the movement of the capillary in respective steps (a) through (i) of the method of the present invention.

Next, as shown in step (g), the capillary 4 is raised to point F1 delivering the wire 3, the amount (or length) of the wire 3 delivered is equal to an inclined portion 33 shown in FIG. 2.

Afterward, the damper (not shown) is closed. Once the damper is closed, the wire 3 is not delivered out of the capillary 4 even if the capillary 4 subsequently moves.

As shown in step (h), the capillary 4 is moved horizontally to point F in the direction of the second bonding point G.

After this movement, as in a conventional method, the capillary 4 is caused to perform a circular-arc motion (or a circular-arc motion followed by a straightly lowering motion) so that the capillary 4 is positioned at the second bonding point G, and then the wire 3 is bonded to this second bonding point G as shown in steps (h) and (i). The operation from point F to the second bonding point G has no direct connection with the gist of the present invention; accordingly, it goes without saying that an operation similar to the operation disclosed in the aforementioned conventional example may be performed, or various other operations may be performed.

As seen from the above, the second reverse operation in step (f) is not merely performed after the capillary 4 has been raised in step (c), but it is rather performed after the kink 3c has been formed by moving the capillary 4 toward the second bonding point G in step (d) and then raising the capillary 4 in step (e). As a result, the kink 3c is formed in the middle of the trapezoidal length portion 32, and the trapezoidal length portion 32 is brought into a shape which is depressed downward or toward the lead frame 1 as a result of the presence of the kink 3c. Accordingly, not only the kink 3b which is stronger than in conventional methods is obtained, but also the position of the kink 3b is stabilized. Thus, a wire loop that has a high shape-retaining strength is formed.

Figure 4:
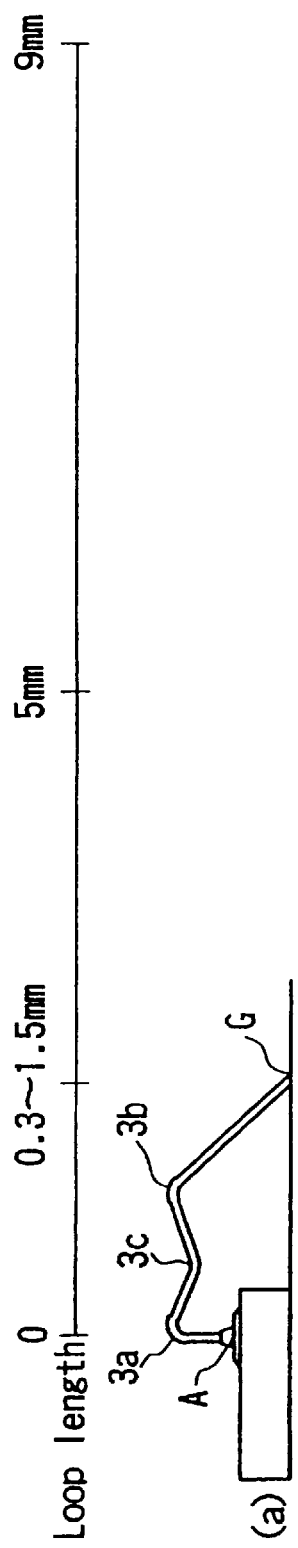
FIGS. 4(a) through 4(d) show various wire loop shapes formed on a wire loop between the first bonding point and the second bonding point.
Figure 4:
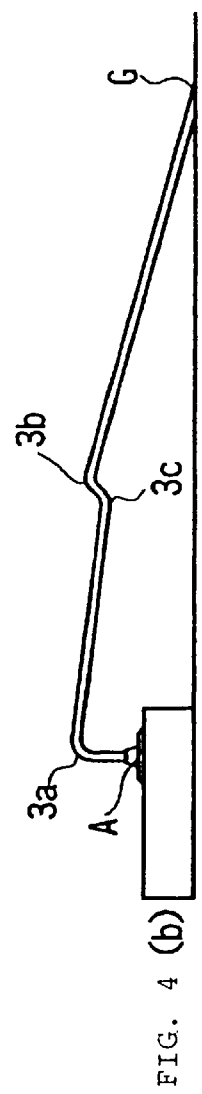
Figure 4:
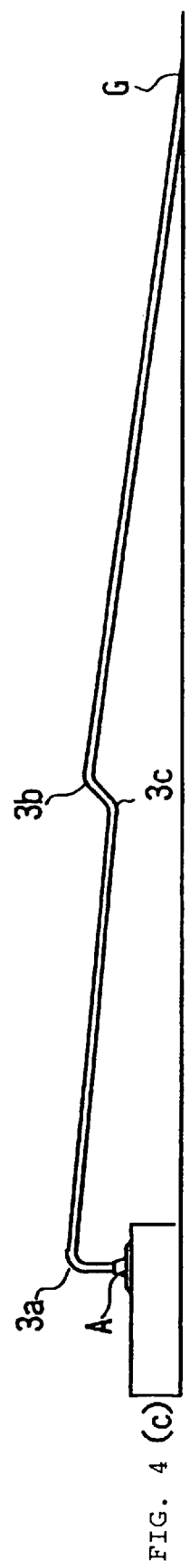
Figure 4:
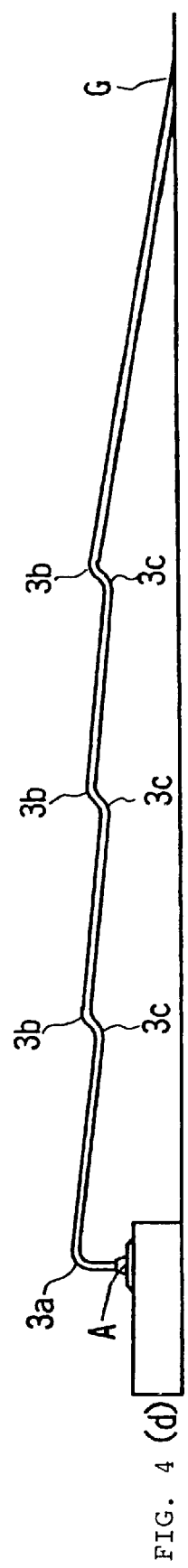

FIGS. 4(a), 4(b), 4(c) and 4(d) show different wire loop shapes which are formed in accordance with the wiring distance between the first bonding point A and the second bonding point G. When the wiring distance is extremely long, the second reverse operation taken in steps (c) through (f) in FIG. 3 is performed three times, so that three pairs of kinks 3b and 3c are formed on the bonding wire as shown in FIG. 4(d). It is also possible to perform the second reverse operation twice or four or more times. Thus, FIGS. 4(a) through 4(d) indicate that the present invention is applicable regardless of the distance between the first and second bonding points.

In the present invention, the second reverse operation shown in steps (c) through (f) of FIG. 3 is performed at least once. In cases where the wiring distance between the first and second bonding points is long, a more stable kink 3b is obtained by forming the kink 3c closer to the kink 3b.

As seen from the above, according to the present invention, a wire loop which connects a first bonding point and a second bonding point has a portion that is depressed downward formed in a linear portion at the top of the loop. In other words, a part of wire loop is bent toward an area located between the first and second bonding points. Accordingly, a stable wire loop shape which has a high shape-retaining strength is obtained. Such a wire loop shape can easily be obtained by performing a second reverse operation in which the capillary is raised slightly, after which the capillary is moved slightly toward the second bonding point, and is then raised slightly and moved slightly in the opposite direction from the second bonding point.

As a result, a stable loop shape can be obtained not only in the case of short loops for a short wiring distance but also in the case of long loops for a long wiring distance. Furthermore, a loop which has a high shape-retaining strength against externally applied pressure can also be obtained. Accordingly, bending of the wire caused by externally applied pressure can be prevented. In other words, the loop according to the present invention has a high shock-absorbing capability with respect to external forces such as shocks or vibration of the wire due to capillary contact or ultrasonic oscillation during bonding to the second bonding point or with respect to external forces such as mold flow during the injection of molding material. Thus, the bonded wire is prevented from bending.

What is claimed is:

1. A wire bonding method in which a first bonding point and a second bonding point are connected by a wire, said method comprising the steps of:

connecting said wire to said first bonding point;

performing a first reverse operation in which a capillary is raised slightly and is then moved slightly in an opposite direction from said second bonding point;

performing at least one second reverse operation in which said capillary is raised, after which said capillary is moved slightly toward said second bonding point, and is then raised and moved in an opposite direction from said second bonding point; and performing a process in which said capillary is raised delivering said wire, after which said capillary is moved toward said second bonding point and said wire is connected to said second bonding point.

2. A semiconductor device comprising a wire loop which connects a first bonding point and a second bonding point, and at least one downward depression formed in a linear portion at a top of the wire loop.

3. The semiconductor device according to claim 2, wherein two of said downward depressions are formed in said wire loop.

4. A semiconductor device wherein a wire loop which connects a first bonding point and a second bonding point is of a trapezoidal loop shape, and a kink is formed in a trapezoidal length portion of said trapezoidal loop shape such that said trapezoidal length portion is formed with a downward depression.

* * * * *